(12) United States Patent
Chen et al.

(10) Patent No.: US 11,494,260 B2
(45) Date of Patent: Nov. 8, 2022

(54) MEMORY WITH AN ERROR CORRECTION FUNCTION AND RELATED MEMORY SYSTEM

(71) Applicant: Etron Technology, Inc., Hsinchu (TW)

(72) Inventors: Ho-Yin Chen, Hsinchu County (TW); Ting-Feng Chang, Kaohsiung (TW); Chun-Chia Chen, Yunlin County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 16/223,136

(22) Filed: Dec. 18, 2018

(65) Prior Publication Data

US 2019/0188076 A1 Jun. 20, 2019

Related U.S. Application Data

(60) Provisional application No. 62/607,291, filed on Dec. 18, 2017.

(51) Int. Cl.
*G06F 11/10* (2006.01)
*G11C 29/52* (2006.01)
*G11C 29/00* (2006.01)
*G06F 11/14* (2006.01)

(52) U.S. Cl.
CPC ...... *G06F 11/1068* (2013.01); *G06F 11/1048* (2013.01); *G06F 11/14* (2013.01); *G11C 29/52* (2013.01); *G11C 29/74* (2013.01)

(58) Field of Classification Search
CPC .. G06F 11/1068; G06F 11/14; G06F 11/1048; G06F 11/1004; G06F 12/0246; G11C 29/74; G11C 29/52
See application file for complete search history.

(56) References Cited

U.S. PATENT DOCUMENTS

| 5,481,670 A * | 1/1996 | Hatashita ............... G11C 29/74 714/6.32 |
| 2005/0097389 A1* | 5/2005 | Tanaka ................ G06F 11/1092 714/5.1 |
| 2008/0263429 A1* | 10/2008 | Jeong ...................... G06F 11/10 714/764 |

FOREIGN PATENT DOCUMENTS

TW 201035983 A1 10/2010

* cited by examiner

*Primary Examiner* — April Y Blair
*Assistant Examiner* — Rong Tang
(74) *Attorney, Agent, or Firm* — Winston Hsu (57) ABSTRACT

A memory with an error correction function includes a controller and a memory cell array. The controller optionally writes written data to a normal storage area and a backup area of the memory cell array, and when the controller reads first data corresponding to the written data from the normal storage area, if at least two errors are included in the first data, the controller reads the backup area to output second data corresponding to the written data from the backup area.

10 Claims, 5 Drawing Sheets

MEMORY WITH AN ERROR CORRECTION FUNCTION AND RELATED MEMORY SYSTEM

CROSS REFERENCE TO RELATED APPLICATIONS

This application claims the benefit of U.S. Provisional Application No. 62/607,291, filed on Dec. 18, 2017 and entitled "MULTI-BITS ERROR DETECT ECC FOR DOUBLE WRITE-READ DRAM SCHEME," the contents of which are incorporated herein by reference.

BACKGROUND OF THE INVENTION

1. Field of the Invention

The present invention relates to a memory, and a related memory system, and particularly to a memory, and a related memory system that have an error-correcting function.

2. Description of the Prior Art

When data are stored in a memory, if the data are important, the data stored in the memory must not include any error. Thus, designing a memory with an error correcting function is a topic for a memory designer. The prior art can utilize an Error-Correcting Code (ECC) function to correct an error existing in data stored in the memory if the data stored in the memory includes the error. However as chances of the data stored in the memory including errors grow higher and higher, for example, during an advanced process of the memory, soft errors included in the data stored in the memory become more often, needs of multi-error correcting on the data stored in the memory grow more and more. However, a memory with a multi-error correcting function is too complicated to design and costs too high. Therefore, how to correct multiple errors of the data stored in the memory is an important topic for the memory designer.

SUMMARY OF THE INVENTION

An embodiment of the present invention provides a memory with an error-correcting function. The memory includes a controller and a memory cell array. The controller optionally writes written data to a normal storage area and a backup area of the memory cell array, and when the controller reads first data corresponding to the written data from the normal storage area, if the first data include at least two errors, the controller reads the backup area to output second data corresponding to the written data from the backup area.

Another embodiment of the present invention provides a memory system with an error-correcting function. The memory system includes a controller, a normal storage memory, and a backup memory, wherein the controller optionally writes written data to the normal storage memory and the backup memory, and when the controller reads first data corresponding to the written data from the normal storage memory, if the first data include at least two errors, the controller outputs reads the backup memory to output second data corresponding to the written data from the backup memory.

Another embodiment of the present invention provides a memory with an error-correcting function. The memory includes a memory cell array, including a normal storage area and a backup area; and a controller, connecting to the memory cell array, optionally writing written data to the normal storage area and the backup area, wherein first data corresponding to the written data read by the controller from the normal storage area, the controller optionally utilizes an ECC function to correct the first data, or reads the backup area to output second data corresponding to the written data from the backup area.

The present invention provides a memory with an error-correcting function, and a memory system. Since the memory utilizes a controller to optionally write written data to a normal storage area and a backup area of the memory, if first data corresponding to the written data stored in the normal storage area include at least two errors, the controller can read second data corresponding to the written data stored in the backup area. Moreover, since the memory system utilizes the controller of the memory system to optionally write the written data to a normal storage memory and a backup memory of the memory system, if first data corresponding to the written data stored in the normal storage memory include at least two errors, the controller can read second data corresponding to the written data stored in the backup memory. Thus, compared to the prior art, the present invention can correct multiple errors included in the data stored in the normal storage area and the data stored in the normal storage memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
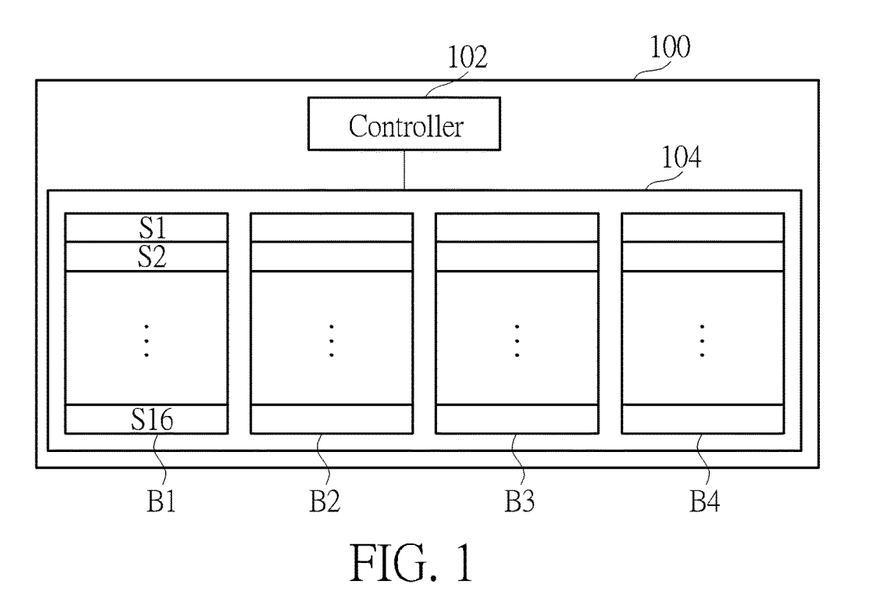
FIG. 1 is a diagram illustrating a memory with an error-correcting function according to a first embodiment of the present invention.

Please refer to FIG. 1. FIG. 1 is a diagram illustrating a memory 100 with an error-correcting function according to a first embodiment of the present invention. As shown in FIG. 1, the memory 100 includes a controller 102 and a memory cell array 104, wherein the memory cell array 104 includes a plurality of banks, each bank of the plurality of banks includes a plurality of sections, and each section of the plurality of sections includes a plurality of memory cells. The memory 100 is a Dynamic Random Access Memory (DRAM). For example, as shown in FIG. 1, the memory cell array 104 includes 4 banks B1-B4, and the bank B1 includes 16 sections S1-S16. However the present invention is not limited to the memory cell array 104 only including 4 banks B1-B4, that is, the memory cell array 104 can includes a plurality of banks. Moreover, the present invention is not limited to the bank B1 only including 16 sections S1-S16, that is, the bank B1 can includes a plurality of sections.

Figure 2:
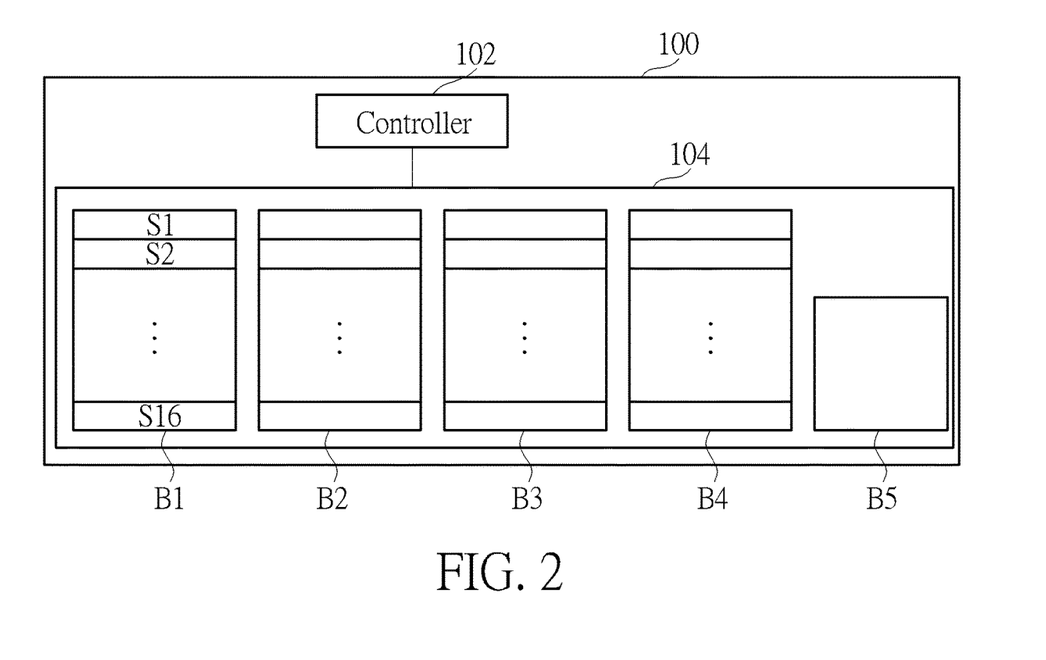
FIG. 2 is a diagram illustrating a memory with an error-correcting function according to another embodiment of the present invention.

As shown in FIG. 1, before the controller 102 writes written data to the memory cell array 104, the controller 102 would first generate a parity bit of an Error-Correcting Code (ECC) corresponding to the written data, wherein a method of the ECC utilizing the parity bit to correct the written data is the prior art to those skilled in the art, so further description thereof is omitted for simplicity. If the written data are not important, the controller 102 writes the written data and the parity bit to a normal storage area in the memory cell array 104. And if the written data are important, for example, if the written data is driving data of a self-driving car, or the written data is flight data of a plane, the controller 102 simultaneously writes the written data and the parity bit to the normal storage area and a backup area in the memory cell array 104. For example, if the written data are important, the controller 102 simultaneously writes the written data to the bank B1 and B4, wherein the banks B1-B3 are the normal storage area and the bank B4 is the backup area. Moreover, in another embodiment of the present invention, the sections S2-S15 in each bank of the banks B1-B4 are the normal storage area and the section S1 in each bank of the banks B1-B4 are the backup area. However, the present invention is not limited to the sections S2-S15 in each bank being the normal storage area and the section S1 in each bank is the backup area. Moreover, if the banks B1-B3 are the normal storage area and the bank B4 is the backup area and size of the memory 100 is 1 G, then size of the normal storage area is 750M and size of the backup area is 250M. That is, a sum of the size (750M) of the normal storage area and the size (250M) of the backup area is equal to the size (1 G) of the memory 100. However, the present invention is not limited to the size of the memory 100 is 1 G, the size of the normal storage area is 750M, and the size of the backup area is 250M. In another embodiment of the present invention, as shown in FIG. 2, the memory cell array 104 includes 5 banks B1-B5, wherein if the banks B1-B4 are the normal storage area and the bank B5 is the backup area, and the size of the memory 100 is 1 G, the size of the normal storage area is 1 G, and the size of the backup area is 250M. That is, the size of the normal storage area (1 G) is equal to the size of the memory 100, and the size of the backup area (250M) is size outside the size of the memory 100 (1 G).

If the written data are not important, the controller 102 reads the data stored in the normal storage area from the normal storage area (that is, first data, wherein the first data correspond to the written data), utilizes an ECC function to check whether the data stored in the normal storage area include errors or not, and outputs the data stored in the normal storage area. And if the written data are important, the controller 102 simultaneously reads the data stored in the normal storage area from the normal storage area and data stored in the backup area from the backup area (that is, second data, wherein the second data correspond to the written data), and simultaneously utilizes the ECC function to check whether the data stored in the normal storage area and the data stored in the backup area include errors or not, wherein the data stored in the normal storage area and the data stored in the backup area correspond to the written data. If the data stored in the normal storage area include no error, the controller 102 directly outputs the data stored in the normal storage area. If the data stored in the normal storage area include one error, the controller 102 directly utilizes the ECC function to correct the error and outputs corrected data. If the data stored in the normal storage area include at least two errors, the controller 102 outputs the data stored in the backup area from the backup area.

However in another embodiment of the present invention, if the written data are important, the controller 102 writes the written data and the parity bit to the normal storage area and the backup area in turn. After the controller 102 writes the written data to the normal storage area and the backup area in turn, when the controller 102 needs to read the data stored in the normal storage area, the controller 102 reads the data stored in the normal storage area from the normal storage area, utilizes the ECC function to check whether the data stored in the normal storage area include any error. If the data stored in the normal storage area include no error, the controller 102 directly outputs the data stored in the normal storage area. If the data stored in the normal storage area include one error, the controller 102 directly utilizes the ECC function to correct the error and outputs corrected data. If the data stored in the normal storage area include at least two errors, the controller 102 does not correct the at least two errors, reads the data stored in the backup area from the backup area, utilizes the ECC function to check whether the data stored in the backup area include any error, and the controller 102 outputs the data stored in the backup area from the backup area.

Figure 3:
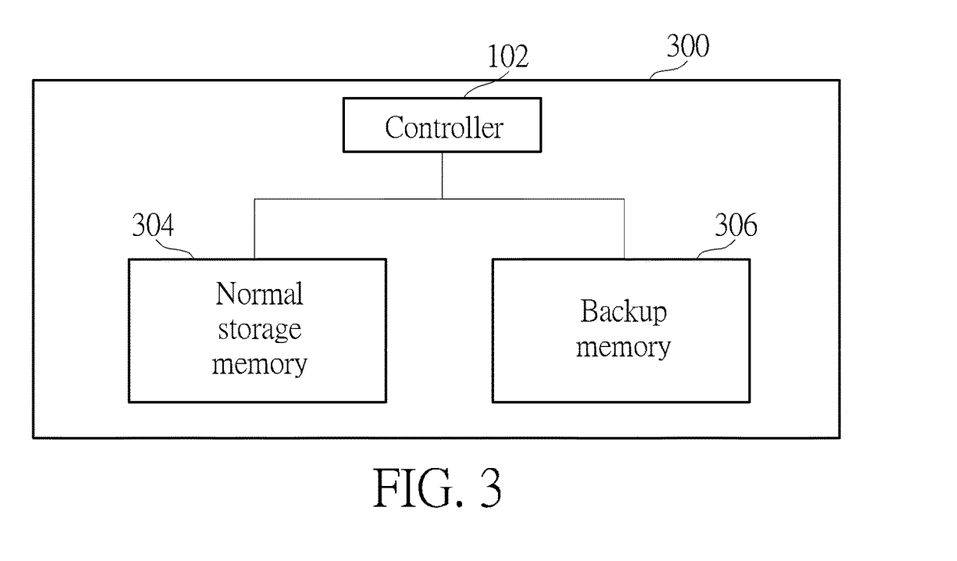
FIG. 3 is a diagram illustrating a memory system with an error-correcting function according to a second embodiment of the present invention.

Please refer to FIG. 3. FIG. 3 is a diagram illustrating a memory system 300 with an error-correcting function according to a second embodiment of the present invention. As shown in FIG. 3, the memory system 300 includes a controller 102, a normal storage memory 304 and a backup memory 306, wherein a difference between the memory system 300 and the memory 100 is that the memory system 300 utilizes the normal storage memory 304 to substitute for the normal storage area of the memory 100 and utilizes the backup memory 306 to substitute for the backup area of the memory 100. In addition, subsequent operational principles of the normal storage memory 304 and the backup memory 306 are the same as those of the normal storage area from the memory 100 and the backup area from the memory 100, so further description thereof is omitted for simplicity.

Figure 4:
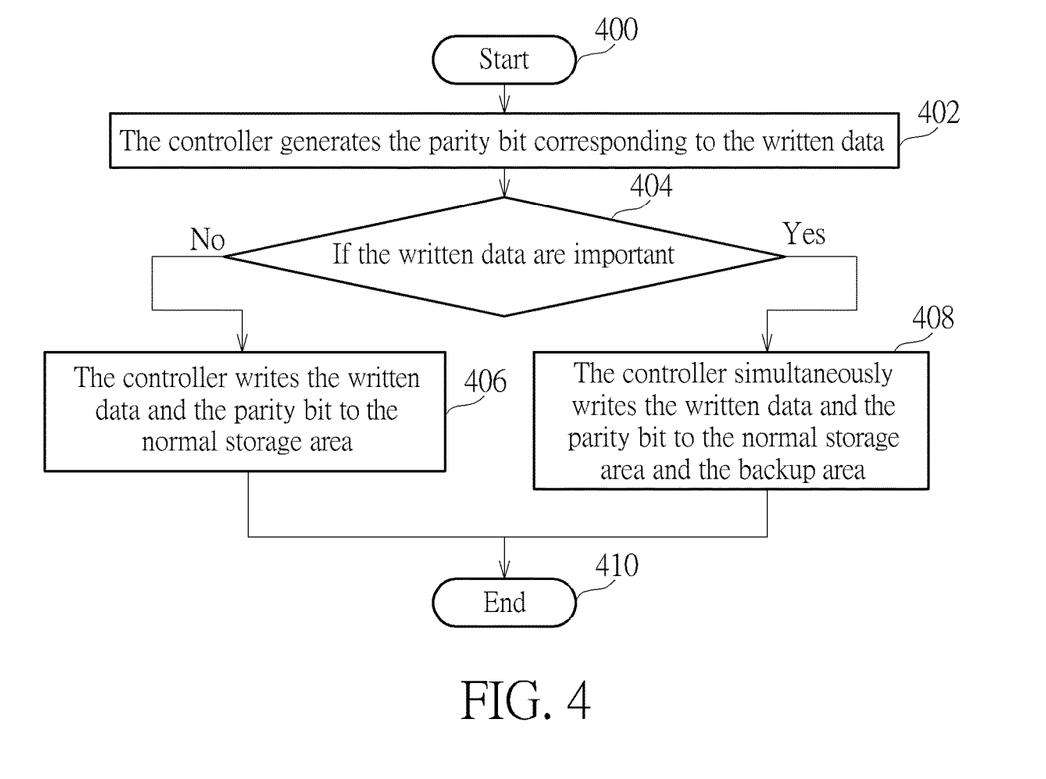
FIG. 4 is a flowchart illustrating an operation method of writing data to a memory with an error-correcting function according to a third embodiment of the present invention.

Please refer to FIG. 4. FIG. 4 is a flowchart illustrating an operation method of writing data to a memory with an error-correcting function according to a third embodiment of the present invention. The operation method in FIG. 4 is illustrated using the memory 100 in FIG. 1. Detailed steps are as follows:

Step 400: Start.

Step 402: The controller 102 generates the parity bit corresponding to the written data.

Step 404: If the written data are important; if no, go to step 406; if yes, go to step 408.

Step 406: The controller 102 writes the written data and the parity bit to the normal storage area.

Step 408: The controller 102 simultaneously writes the written data and the parity bit to the normal storage area and the backup area.

Step 410: End.

In step 402, before the controller 102 writes the written data to the memory cell array 104, the controller 102 first generates the parity bit corresponding to the written data. In step 408, if the written data are important, for example, if the written data is driving data of a self-driving car, or the written data is flight data of a plane, the controller 102 simultaneously writes the written data and the parity bit to the normal storage area and the backup area. For example, if the written data are important, the controller 102 simultaneously writes the written data to the bank B1 and B4, wherein the banks B1-B3 are the normal storage area and the bank B4 is the backup area.

Figure 5:
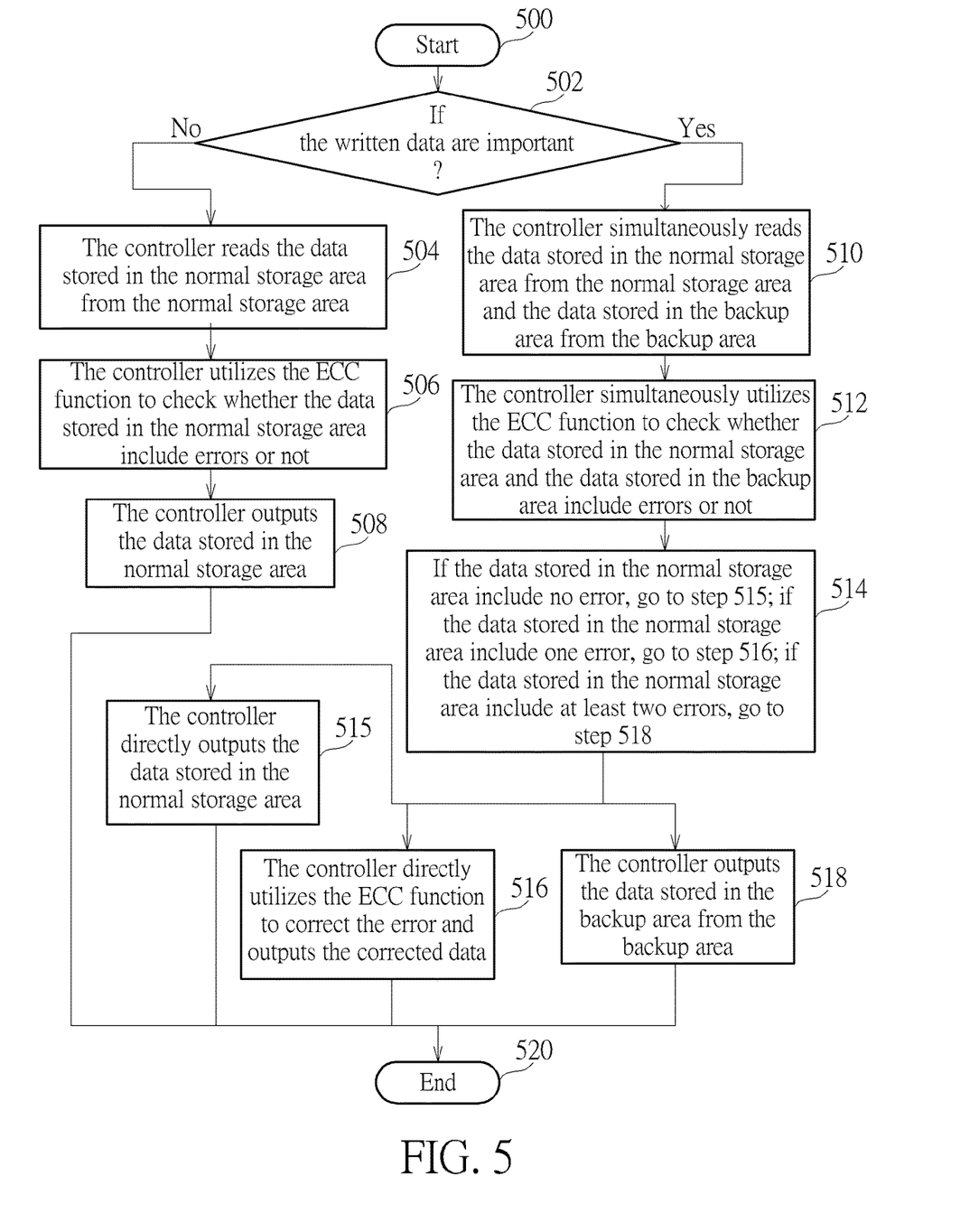
FIG. 5 is a flowchart illustrating an operation method of reading data to a memory with an error-correcting function according to a fourth embodiment of the present invention.

Please refer to FIG. 5. FIG. 5 is a flowchart illustrating an operation method of reading data to a memory with an error-correcting function according to a fourth embodiment of the present invention. The operation method in FIG. 5 is illustrated using the memory 100 in FIG. 1. Detailed steps are as follows:

Step 500: Start.

Step 502: If the written data are important; if no, go to step 504; if yes, go to step 510.

Step 504: The controller 102 reads the data stored in the normal storage area from the normal storage area.

Step 506: The controller 102 utilizes the ECC function to check whether the data stored in the normal storage area include errors or not.

Step 508: The controller 102 outputs the data stored in the normal storage area.

Step 510: The controller 102 simultaneously reads the data stored in the normal storage area from the normal storage area and the data stored in the backup area from the backup area.

Step 512: The controller 102 simultaneously utilizes the ECC function to check whether the data stored in the normal storage area and the data stored in the backup area include errors or not.

Step 514: If the data stored in the normal storage area include no error, go to step 515; if the data stored in the normal storage area include one error, go to step 516; if the data stored in the normal storage area include at least two errors, go to step 518.

Step 515: The controller 102 directly outputs the data stored in the normal storage area.

Step 516: The controller 102 directly utilizes the ECC function to correct the error and outputs the corrected data.

Step 518: The controller 102 outputs the data stored in the backup area from the backup area.

Step 520: End.

In step 510, if the written data are important, the controller 102 simultaneously reads the data stored in the normal storage area from the normal storage area and the data stored in the backup area from the backup area. In step 512, the controller 102 simultaneously utilizes the ECC function to check whether the data stored in the normal storage area and the data stored in the backup area include errors or not. In step 515, because the data stored in the normal storage area include no error, the controller 102 directly outputs the data stored in the normal storage area. In step 516, if the data stored in the normal storage area include one error, the controller 102 utilizes the ECC function to correct the error and outputs the corrected data. In step 518, if the data stored in the normal storage area include at least two errors, the controller 102 does not correct the at least two errors, and outputs the data stored in the backup area from the backup area.

Figure 6:
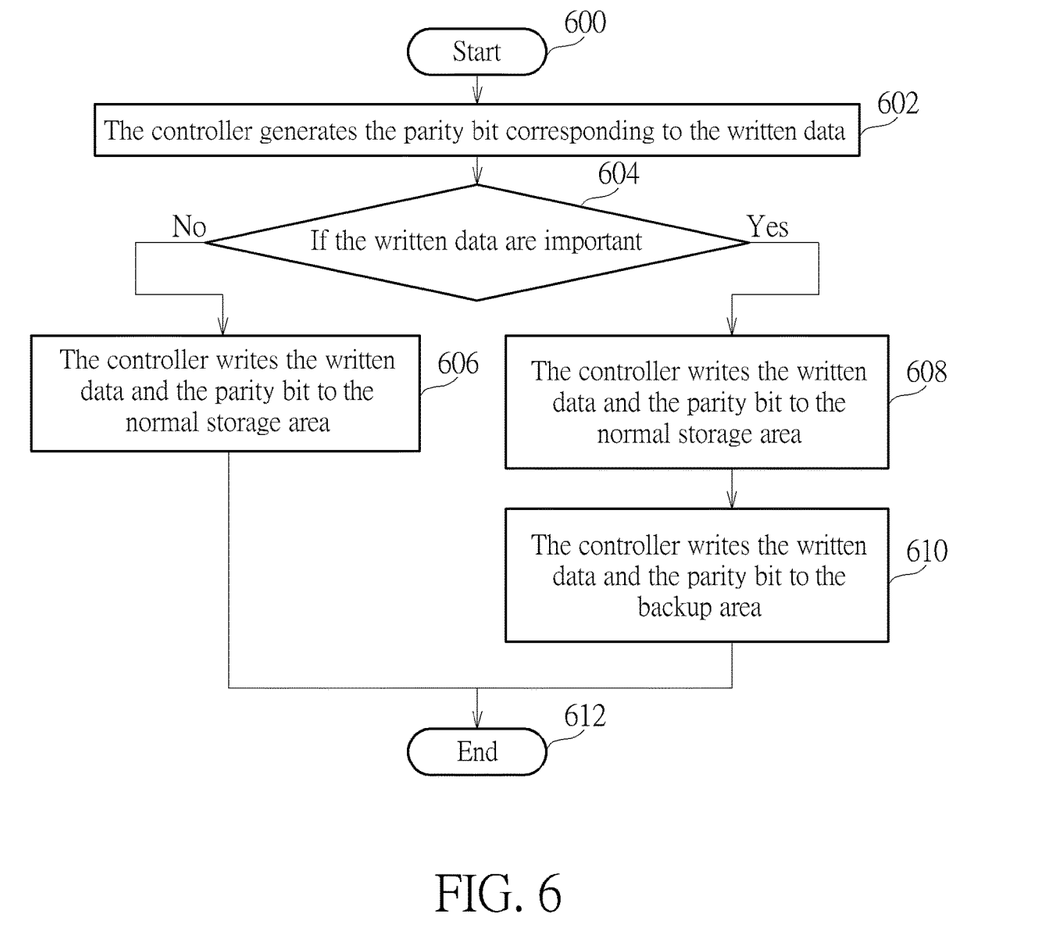
FIG. 6 is a flowchart illustrating an operation method of writing data to a memory with an error-correcting function according to a fifth embodiment of the present invention.

Please refer to FIG. 6. FIG. 6 is a flowchart illustrating an operation method of writing data to a memory with an error-correcting function according to a fifth embodiment of the present invention. The operation method in FIG. 6 is illustrated using the memory 100 in FIG. 1. Detailed steps are as follows:

Step 600: Start.

Step 602: The controller 102 generates the parity bit corresponding to the written data.

Step 604: If the written data are important; if no, go to step 606; if yes, go to step 608.

Step 606: The controller 102 writes the written data and the parity bit to the normal storage area.

Step 608: The controller 102 writes the written data and the parity bit to the normal storage area.

Step 610: The controller 102 writes the written data and the parity bit to the backup area.

Step 612: End.

Differences between the fifth embodiment in FIG. 6 and the third embodiment in FIG. 3 are that when the written data are important, the controller 102 writes the written data and the parity bit to the normal storage area in Step 608, and writes the written data and the parity bit to the backup area in Step 610 in turn.

Figure 7:
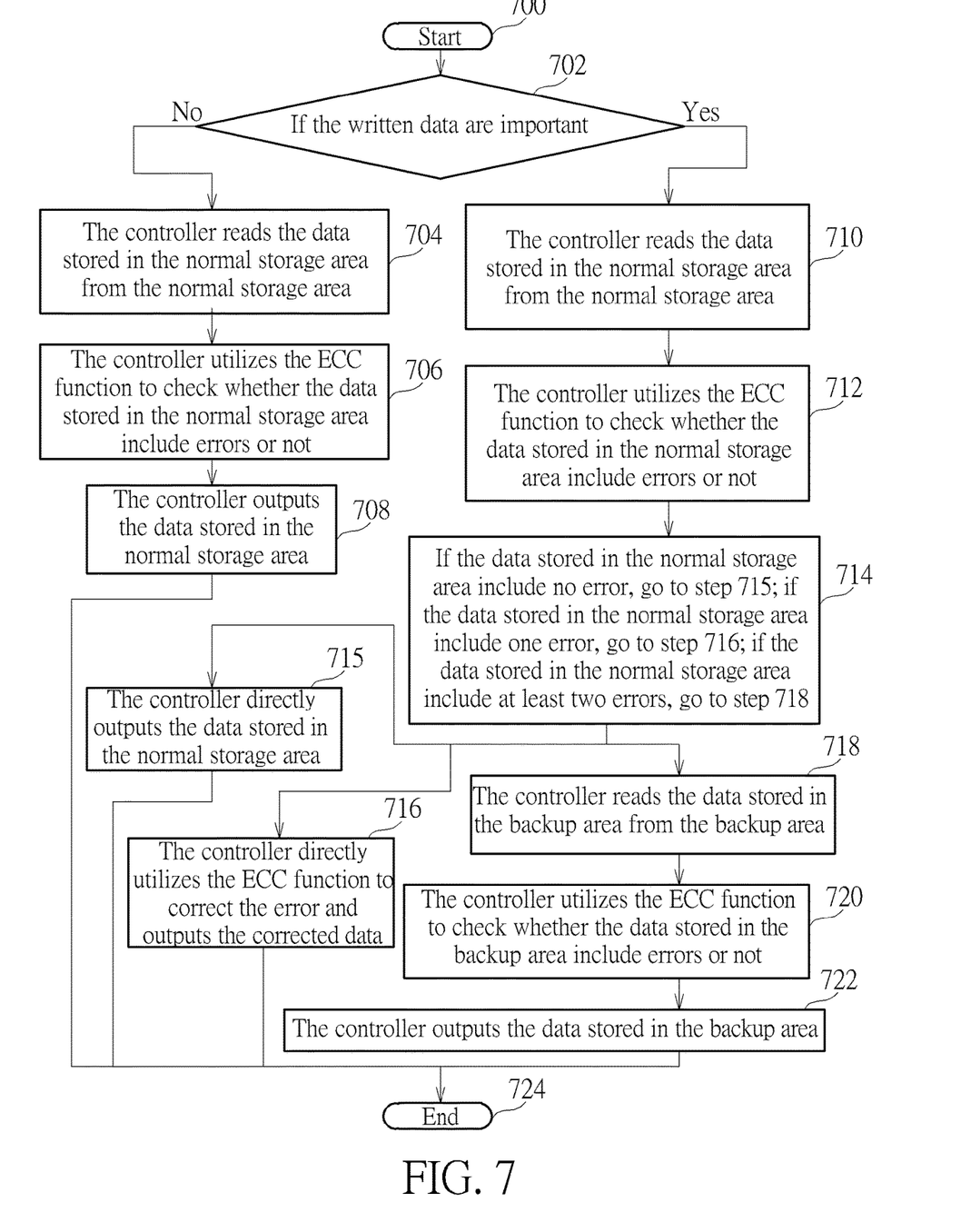
FIG. 7 is a flowchart illustrating an operation method of reading data to a memory with an error-correcting function according to a sixth embodiment of the present invention.

Please refer to FIG. 7. FIG. 7 is a flowchart illustrating an operation method of reading data to a memory with an error-correcting function according to a sixth embodiment of the present invention. The operation method in FIG. 7 is illustrated using the memory 100 in FIG. 1. Detailed steps are as follows:

Step 700: Start.

Step 702: If the written data are important; if no, go to step 704; if yes, go to step 710.

Step 704: The controller 102 reads the data stored in the normal storage area from the normal storage area.

Step 706: The controller 102 utilizes the ECC function to check whether the data stored in the normal storage area include errors or not.

Step 708: The controller 102 outputs the data stored in the normal storage area.

Step 710: The controller 102 reads the data stored in the normal storage area from the normal storage area.

Step 712: The controller 102 utilizes the ECC function to check whether the data stored in the normal storage area include errors or not.

Step 714: If the data stored in the normal storage area include no error, go to step 715; if the data stored in the normal storage area include one error, go to step 716; if the data stored in the normal storage area include at least two errors, go to step 718.

Step 715: The controller 102 directly outputs the data stored in the normal storage area.

Step 716: The controller 102 directly utilizes the ECC function to correct the error and outputs the corrected data.

Step 718: The controller 102 reads the data stored in the backup area from the backup area.

Step 720: The controller 102 utilizes the ECC function to check whether the data stored in the backup area include errors or not.

Step 722: The controller 102 outputs the data stored in the backup area.

Step 724: End.

Differences between the sixth embodiment in FIG. 7 and the fourth embodiment in FIG. 4 are that if the written data are important, the controller 102 first reads the data stored in the normal storage area from the normal storage area in step 710; in step 712, the controller 102 utilizes the ECC function to check whether the data stored in the normal storage area include errors or not; in step 715, because the data stored in the normal storage area include no error, the controller 102 directly outputs the data stored in the normal storage area; in step 716, if the data stored in the normal storage area include one error, the controller 102 utilizes the ECC function to correct the error and outputs corrected data; in step 718, if the data stored in the normal storage area include at least two errors, the controller 102 does not correct the at least two errors, reads the data stored in the backup area from the backup area; in step 720, the controller 102 utilizes the ECC function to check whether the data stored in the backup area include errors or not; in step 722, the controller 102 outputs the data stored in the backup area.

In addition, the memory system 300 can be operated by the method of writing data and the method of reading data corresponding to the memory 100 described in FIGS. 4-7, so further description thereof is omitted for simplicity.

To sum up, the present invention provides the memory, the related operation methods, and the memory system. Since the memory and the operation methods utilize the controller to optionally write the written data to the normal storage area and the backup area, if the data stored in the normal storage area include at least two errors, the controller can read the data stored in the backup area. Moreover, since the memory system utilizes the controller of the memory system to optionally write the written data to the normal storage memory and the backup memory of the memory system, if the data stored in the normal storage memory include at least two errors, the controller can read the data stored in the backup memory. Thus, compared to the prior art, the present invention can correct multiple errors included in the data stored in the normal storage area and the data stored in the normal storage memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory with an error-correcting function, comprising:
   a controller; and
   a memory cell array, wherein the controller writes written data to a normal storage area and a backup area of the memory cell array, and the written data comprise one or more errors, wherein after the controller writes the written data to the normal storage area and the backup area of the memory cell array and when the controller simultaneously reads first data corresponding to the written data from the normal storage area and second data corresponding to the written data from the backup area, the controller simultaneously utilizes Error-Correcting Code (ECC) function to check whether the first data and the second data comprise errors, and if at least two errors are comprised in the first data, the controller reads the backup area to output the second data corresponding to the written data from the backup area;
   wherein the memory is a Dynamic Random Access Memory (DRAM), a time period between the controller reading the first data and outputting the second data meets read/write timing of DRAM, and the second data from the backup area comprise no error.

2. The memory of claim 1, wherein a sum of a size of the normal storage area and a size of the backup area is equal to a size of the memory.

3. The memory of claim 1, wherein a size of the normal storage area is equal to a size of the memory, and a size of the backup area is outside the size of the memory.

4. The memory of claim 1, wherein the controller simultaneously writes the written data to the normal storage area and the backup area.

5. The memory of claim 1, wherein if the first data comprise one error, the controller utilizes the ECC function to correct the error and outputs corrected data, and if the first data comprise the at least two errors, the controller reads the second data from the backup area and outputs the second data.

6. The memory of claim 5, wherein when the at least two errors are comprised in the first data, the controller further utilizes the ECC function to check whether the second data comprise errors or not.

7. A memory system with an error-correcting function, comprising:
   a controller;
   a normal storage memory; and
   a backup memory, wherein the controller writes data to the normal storage memory and the backup memory, the data comprise one or more errors, and when the controller simultaneously reads first data corresponding to the data from the normal storage memory and second data corresponding to the data from the backup memory, the controller simultaneously utilizes Error-Correcting Code (ECC) function to check whether the first data and the second data comprise errors, and if at least two errors are comprised in the first data, the controller reads the backup memory to output the second data corresponding to the data from the backup memory;
   wherein the normal storage memory and the backup memory are Dynamic Random Access Memories, a time period between the controller reading the first data and outputting the second data meets read/write timing of DRAM, and the second data from the backup memory comprise no error.

8. A memory with an error-correcting function, comprising:
   a memory cell array comprising a normal storage area and a backup area; and
   a controller coupled to the memory cell array, executing write operation to write written data to the normal storage area and the backup area, wherein the written data comprise one or more errors, and after the controller writes the written data to the normal storage area and the backup area of the memory cell array and when the controller executes read operation to simultaneously read first data corresponding to the written data from the normal storage area and second data corresponding to the written data from the backup area and the first data comprise at least one error, the controller simultaneously utilizes Error-Correcting Code (ECC) function to check whether the first data and the second data comprise errors, and the first data comprise at least one error, the controller utilizes the ECC function to correct the first data, or reads the second data corresponding to the written data from the backup area to output the second data;
   wherein the memory is a Dynamic Random Access Memory (DRAM), a time period between the controller reading the first data and outputting the second data meets read/write timing of DRAM, and the second data from the backup area comprises no error.

9. The memory of claim 8, wherein the controller determines whether to correct the first data or to read the backup area to output the second data according to a number of the at least one error comprised in the first data.

10. The memory of claim 8, wherein the controller utilizes the ECC function to check whether the first data comprise errors or not, when the first data comprise one error, the controller utilizes the ECC function to correct the error and output corrected first data, and when the first data comprise at least two errors, the controller does not correct the at least two errors and reads the backup area to output the second data.

* * * * *